United States Patent
Wang et al.

(10) Patent No.: US 10,559,510 B2
(45) Date of Patent: Feb. 11, 2020

(54) MOLDED WAFER LEVEL PACKAGING

(71) Applicant: SEMICONDUCTOR COMPONENTS INDUSTRIES, LLC, Phoenix, AZ (US)

(72) Inventors: Soon Wei Wang, Seremban (MY); Jin Yoong Liong, Seremban (MY); Chee Hiong Chew, Seremban (MY); Francis J. Carney, Mesa, AZ (US)

(73) Assignee: Semiconductor Components Industries, LLC, Phoeniz, AZ (US)

( * ) Notice: Subject to any disclaimer, the term of this patent is extended or adjusted under 35 U.S.C. 154(b) by 0 days.

(21) Appl. No.: 15/812,591

(22) Filed: Nov. 14, 2017

(65) Prior Publication Data

US 2019/0067143 A1    Feb. 28, 2019

Related U.S. Application Data

(60) Provisional application No. 62/549,733, filed on Aug. 24, 2017.

(51) Int. Cl.
*H01L 23/31* (2006.01)
*H01L 21/78* (2006.01)
(Continued)

(52) U.S. Cl.
CPC .... *H01L 23/3114* (2013.01); *H01L 21/31053* (2013.01); *H01L 21/561* (2013.01);
(Continued)

(58) Field of Classification Search
CPC ..... H01L 23/3114; H01L 24/96; H01L 21/78; H01L 25/072
See application file for complete search history.

(56) References Cited

U.S. PATENT DOCUMENTS 4,754,317 A * 6/1988 Comstock ......... H01L 23/49531
257/668
6,646,329 B2  11/2003 Estacio et al.
(Continued)

FOREIGN PATENT DOCUMENTS

EP    2741327 A1    6/2014

OTHER PUBLICATIONS

Islam, Nokibul et al."Molded Flip Chip-FCmBGA", I MAPS International Conference and Exhibition on Device Packaging, Mar. 17-20, 2008, 5 pages.
(Continued)

*Primary Examiner* — Kyoung Lee
*Assistant Examiner* — Christina A Sylvia
(74) *Attorney, Agent, or Firm* — Brake Hughes Bellerman LLP

(57) ABSTRACT

In a general aspect, an apparatus can include a metal layer, a first semiconductor die, a second semiconductor die, a molding compound, a first electrical contact and a second electrical contact. The first semiconductor die can have a first side disposed on the metal layer. The second semiconductor die can have a first side disposed on the metal layer. The metal layer can electrically couple the first side of the first semiconductor die with the first side of the second semiconductor die. The molding compound can at least partially encapsulate the metal layer, the first semiconductor die and the second semiconductor die. The first electrical contact can be to a second side of the first semiconductor die and disposed on a surface of the apparatus. The second electrical contact can be to a second side of the second semiconductor die and disposed on the surface of the apparatus.

17 Claims, 7 Drawing Sheets

(51) Int. Cl.
    *H01L 21/56*     (2006.01)
    *H01L 23/00*     (2006.01)
    *H01L 21/3105*     (2006.01)
    *H01L 23/492*     (2006.01)
    *H01L 25/07*     (2006.01)
    *H01L 25/18*     (2006.01)

(52) U.S. Cl.
    CPC ............ *H01L 21/565* (2013.01); *H01L 21/78* (2013.01); *H01L 23/492* (2013.01); *H01L 24/11* (2013.01); *H01L 24/13* (2013.01); *H01L 24/96* (2013.01); *H01L 25/072* (2013.01); *H01L 25/18* (2013.01); *H01L 2224/13022* (2013.01); *H01L 2224/13147* (2013.01); *H01L 2224/13155* (2013.01); *H01L 2924/1203* (2013.01); *H01L 2924/13091* (2013.01)

(56) References Cited

U.S. PATENT DOCUMENTS

| | | |
|---|---|---|
| 6,677,669 B2 | 1/2004 | Standing |
| 7,777,315 B2 | 8/2010 | Noquil |
| 9,673,316 B1* | 6/2017 | Blair ................... H01L 29/7802 |
| 2002/0179994 A1 | 12/2002 | Chen et al. |
| 2005/0023658 A1 | 2/2005 | Tabira et al. |
| 2011/0018116 A1* | 1/2011 | Feng ................... H01L 29/0657 257/690 |
| 2012/0104580 A1* | 5/2012 | Feng ..................... H01L 21/561 257/673 |
| 2012/0273873 A1 | 11/2012 | Grey |
| 2013/0089953 A1 | 4/2013 | Ashrafzadeh |
| 2014/0091458 A1 | 4/2014 | Van Gemert et al. |
| 2014/0239413 A1* | 8/2014 | Stella ................ H01L 23/49548 257/401 |
| 2015/0162270 A1 | 6/2015 | Ashrafzadeh et al. |

OTHER PUBLICATIONS

Extended European Search Report for European Application No. 18183293.2, dated Nov. 27, 2018, 12 pages.

* cited by examiner

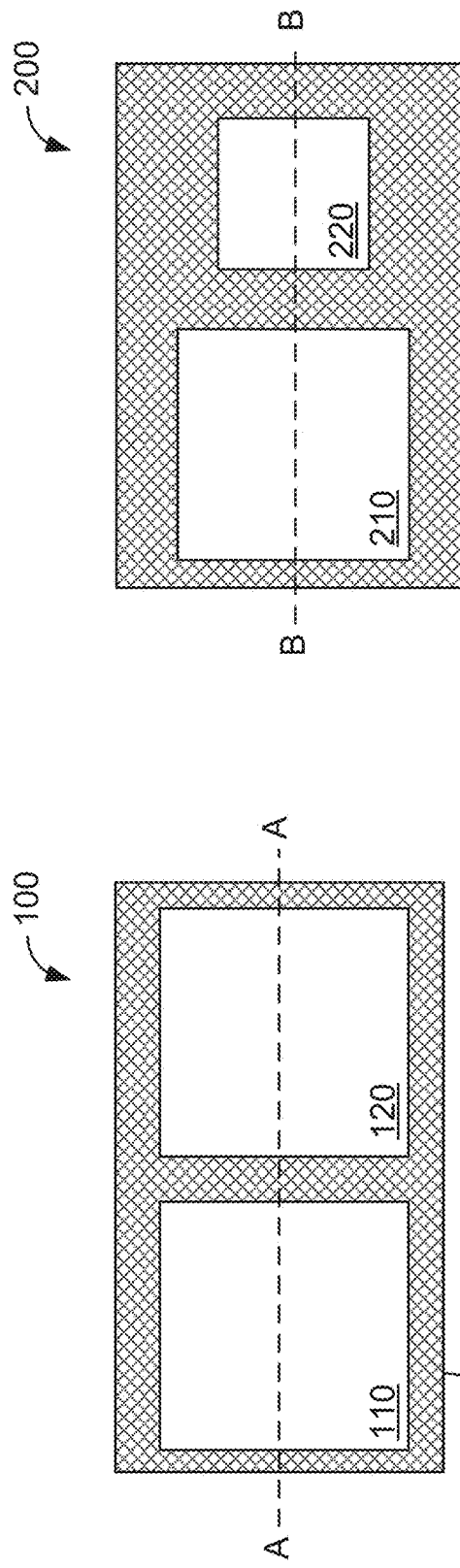
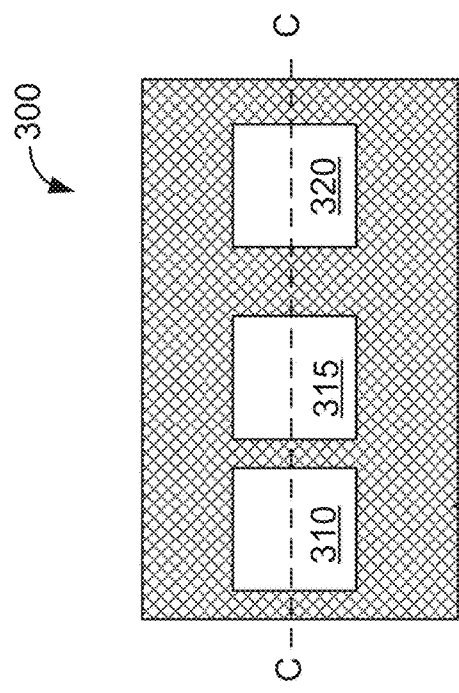

MOLDED WAFER LEVEL PACKAGING

CROSS-REFERENCE TO RELATED APPLICATION

This application claims the benefit of and priority to U.S. Provisional Application No. 62/549,733, filed Aug. 24, 2017, entitled "Development of Industry Smallest and Thinnest Package in Molded Wafer Level Packaging (mWLP)", the content of which is hereby incorporated by reference in its entirety.

TECHNICAL FIELD

This description relates to semiconductor device packaging assemblies, and corresponding methods of manufacture. More specifically, this description relates to wafer level packaging of semiconductor devices.

SUMMARY

In a general aspect, an apparatus can include a metal layer, a first semiconductor die, a second semiconductor die, a molding compound, a first electrical contact and a second electrical contact. The first semiconductor die can have a first side and a second side that is opposite the first side, the first side of the first semiconductor die being disposed on the metal layer. The second semiconductor die can have a first side and a second side that is opposite the first side, the first side of the second semiconductor die being disposed on the metal layer. The metal layer can electrically couple the first side of the first semiconductor die with the first side of the second semiconductor die. The molding compound can at least partially encapsulate the metal layer, the first semiconductor die and the second semiconductor die. The first electrical contact can be to the second side of the first semiconductor die and disposed on a surface of the apparatus. The second electrical contact can be to the second side of the second semiconductor die and disposed on the surface of the apparatus.

BRIEF DESCRIPTION OF THE DRAWINGS

In the drawings, which are not necessarily drawn to scale, like numerals may reference similar components in different views. The drawings illustrate generally, by way of example, but not by way of limitation, various embodiments discussed in the present document.

FIG. 1 is a diagram illustrating a plan view of a wafer-level semiconductor package assembly.

FIG. 2 is a diagram illustrating a plan view of another wafer-level semiconductor package assembly.

FIG. 3 is a diagram illustrating a plan view of yet another wafer-level semiconductor package assembly.

DETAILED DESCRIPTION

Figure 4A:
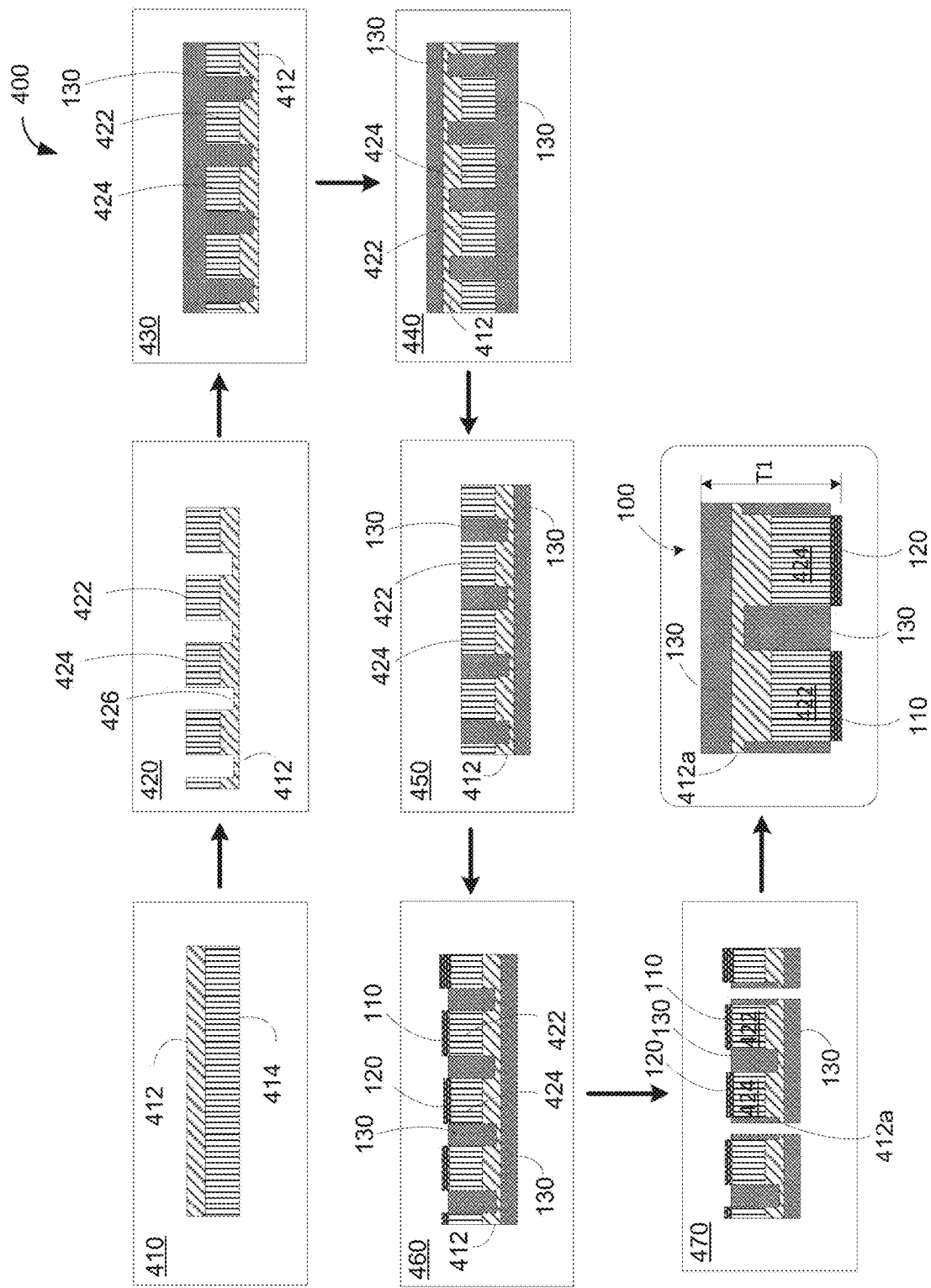
FIG. 4A is a diagram illustrating cross-sectional views of a manufacturing flow for producing the wafer-level package assembly of FIG. 1.

This disclosure relates to semiconductor device package assemblies (package assemblies, packages, assemblies, etc.) and associated methods of manufacture. More specifically, this disclosure relates to multi-chip package assemblies (e.g., package assemblies that include multiple semiconductor dice) that can be produced using wafer-level processing techniques, such those described herein. While packages assemblies including two semiconductor dice are described herein, the approaches described herein can be used to produce package assemblies including different numbers of semiconductor dice, such as three semiconductor dice or more.

The package assemblies described herein, and their associated methods of manufacture, can have certain advantages over current approaches. For instance, package assemblies described herein allow for elimination of one or more substrates in a multi-chip package assembly, and also can be produced without using wire bonding. Such approaches can allow for reduction in package assembly size, such as overall package dimensions including width, length and thickness. Alternatively, the approaches described herein can allow for the use of a larger die size in a package assembly of a given width and length. For example, current approaches can allow for semiconductor dice included in a multi-chip package assembly to have an overall surface area (e.g., combined surface area of all semiconductor dice) that is approximately 40-50% of the surface area (e.g., width×length) of the package assembly. Using the approaches described herein, the overall surface area of the semiconductor dice can be 80-90% of the package assembly surface area.

Further, using the approaches described herein, multi-chip package assemblies having a thickness of 200 micrometers (μm) or less can be produced. Still further, manufacturing processes for producing multi-chip package assemblies as described herein may provide cost savings over current manufacturing process approaches (e.g., elimination of ceramic substrates, elimination of wire bonding processing, reduced assembly process complexity, etc.). Also, elimination of wire bonding processing can improve reliability of multi-chip package assemblies, such as those disclosed herein as compared to current multi-chip package assemblies.

FIG. 1 is a diagram illustrating a plan view of a wafer-level semiconductor package assembly 100. The package assembly 100 can be produced, for example, using the assembly manufacturing flow shown in FIG. 4, which is described below. Briefly, however, the package assembly 100 of FIG. 1 is shown with a section line A-A, which is a section line along which the cross-sectional views of FIG. 4 are taken.

As shown in FIG. 1, the package assembly 100 includes a first electrical contact 110 and a second electrical contact 120, which can both be disposed on a surface of the package assembly 100. In some implementations, the electrical contact 110 can be to a first semiconductor die that is disposed within the package assembly 100, while the electrical contact 120 can be to a second semiconductor die that is also disposed within the package assembly 100. For example, the first electrical contact 110 can be a surface (e.g., a portion of a surface) of the first semiconductor die, or can be a conductive material, such as a solder bump, that is disposed on a surface of the first semiconductor die. Similarly, the second electrical contact 120 can be a surface (e.g., a portion of a surface) of the second semiconductor die, or can be a conductive material, such as a solder bump, that is disposed on a surface of the second semiconductor die.

In some implementations, the first semiconductor die can include a first diode and the second semiconductor die can include a second diode, where the first diode is electrically coupled with the second diode within the package assembly 100, such as using the techniques described herein. In the package assembly 100, the first semiconductor die and the second semiconductor die can be of a same size (e.g., approximately a same size, substantially a same size, etc.). In other implementations, the first semiconductor die and/or the second semiconductor die of the package assembly 200 can include different electrical devices, such as resistors, transistors, capacitors, etc.

As also shown in FIG. 1, the package assembly 100 can include a molding compound 130. The molding compound 130 can be an epoxy molding compound, a liquid molding compound, or other appropriate molding compound for the particular implementation. The first electrical contact 110 and the second electrical contact 120 can be exposed through the molding compound 130. For example, in certain implementations, a surface of (e.g., at least a portion of a surface of) the first semiconductor die, and a surface of (e.g., at least a portion of a surface of) the second semiconductor die of the package assembly 100 can be exposed through the molding compound 130. Further in the package assembly 100, a conductive material, such as a solder or other conductive material, can be disposed on the exposed surface of the first semiconductor die and the exposed surface of second semiconductor die to form, respectively, the electrical contact 110 and the electrical contact 120. Electrical contacts 110 and 120 can be used to electrically couple the package assembly 100 with, e.g., a printed circuit board.

As also shown in FIG. 1, the package assembly 100 can have a length of L1 and a width of W1, where L1 and W1 can vary depending on the particular implementation. In example implementations, L1 can be between 0.40 millimeters (mm) and 10.00 mm, while W1 can be between 0.20 mm and 10.00 mm. In other implementations, L1 and W1 can have different values.

Figure 5A:
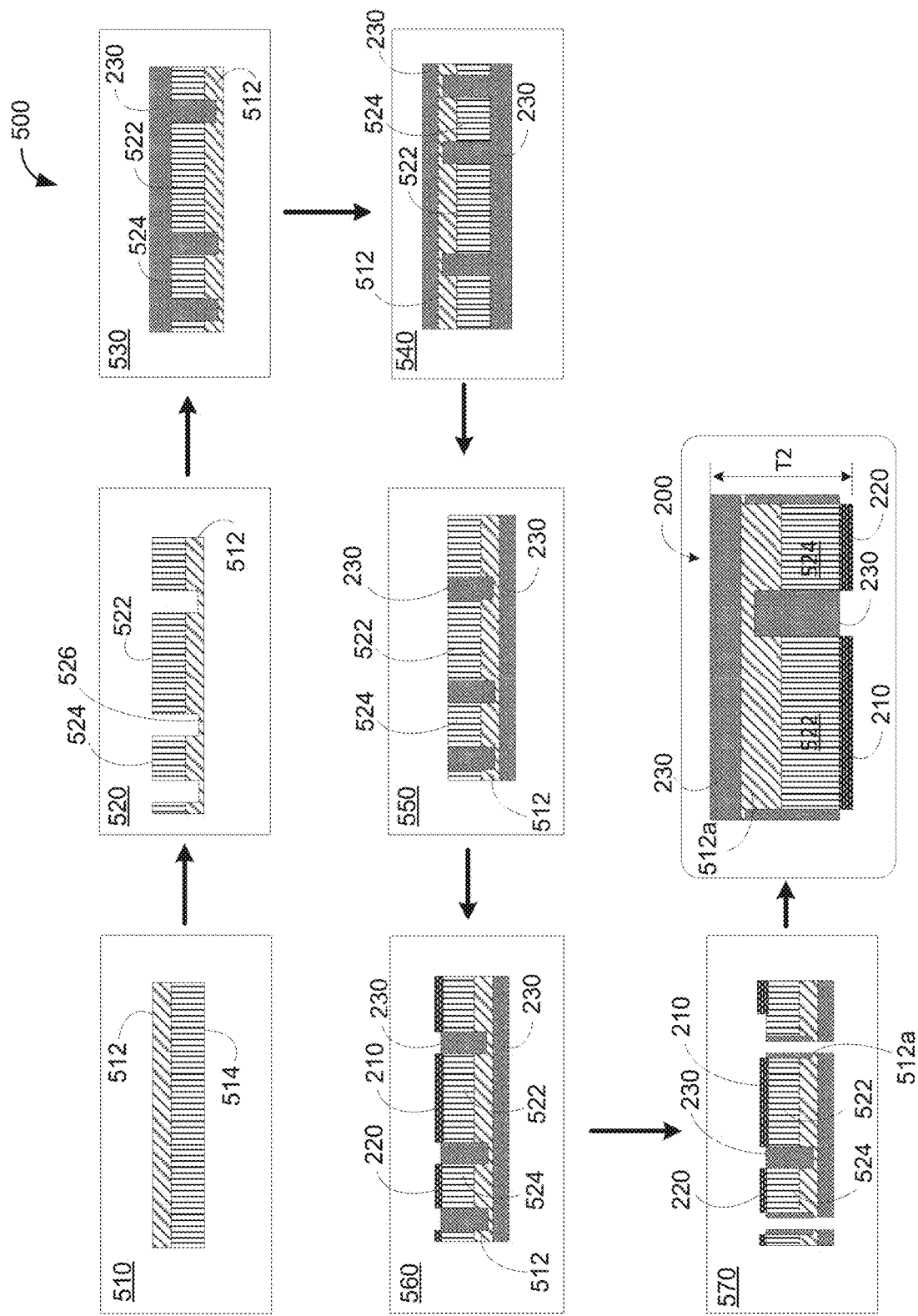
FIG. 5A is a diagram illustrating cross-sectional views of a manufacturing flow for producing the wafer-level package assembly of FIG. 2.

FIG. 2 is a diagram illustrating a plan view of another wafer-level semiconductor package assembly 200. The package assembly 200 can be produced, for example, using the assembly manufacturing flow shown in FIG. 5A, which is described below. Briefly, however, the package assembly 200 of FIG. 2 is shown with a section line B-B, which is a section line along which the cross-sectional views of FIG. 5A are taken.

As shown in FIG. 2, the package assembly 200 includes a first electrical contact 210 and a second electrical contact 220, which can both be disposed on a surface of the package assembly 200. In some implementations, the electrical contact 210 can be to a first semiconductor die that is disposed within the package assembly 200, while the electrical contact 220 can be to a second semiconductor die that is also disposed within the package assembly 200. For example, the first electrical contact 210 can be a surface (e.g., a portion of a surface) of the first semiconductor die, or can be a conductive material, such as a solder bump, that is disposed on a surface of the first semiconductor die. Similarly, the second electrical contact 220 can be a surface (e.g., a portion of a surface) of the second semiconductor die, or can be a conductive material, such as a solder bump, that is disposed on a surface of the second semiconductor die.

In some implementations, the first semiconductor die can include a first diode and the second semiconductor die can include a second diode, where the first diode is electrically coupled with the second diode within the package assembly 200, such as using the techniques described herein. In the package assembly 200, the first semiconductor die and the second semiconductor die can be of different sizes. For instance the first semiconductor die can be larger than the second semiconductor die (e.g., the first semiconductor die can include a diode that is larger than a diode of the second semiconductor die). In other implementations, the first semiconductor die and/or the second semiconductor die of the package assembly 200 can include different electrical devices, such as resistors, transistors, capacitors, etc.

As also shown in FIG. 2, the package assembly 200 can include a molding compound 230. The molding compound 230, as with the molding compound 130 of the package assembly 100, can be an epoxy molding compound, a liquid molding compound, or other appropriate molding compound for the particular implementation. The first electrical contact 210 and the second electrical contact 220 can be exposed through the molding compound 230. For example, in certain implementations, a surface of (e.g., at least a portion of a surface of) the first semiconductor die, and a surface of (e.g., at least a portion of a surface of) the second semiconductor die of the package assembly 200 can be exposed through the molding compound 230. Further in the package assembly 200, a conductive material, such as a solder or other conductive material, can be disposed on the exposed surface of the first semiconductor die and the exposed surface of second semiconductor die to form, respectively, the electrical contact 210 and the electrical contact 220. Electrical contacts 210 and 220 can be used to electrically couple the package assembly 200 with, e.g., a printed circuit board.

As also shown in FIG. 2, the package assembly 200 can have a length of L2 and a width of W2, where L2 and W2 can vary depending on the particular implementation. In example implementations, L2 can be between 0.40 mm and 10.00 mm, while W2 can be between 0.20 mm and 10.00 mm. In other implementations, L2 and W2 can have different values.

Figure 6A:
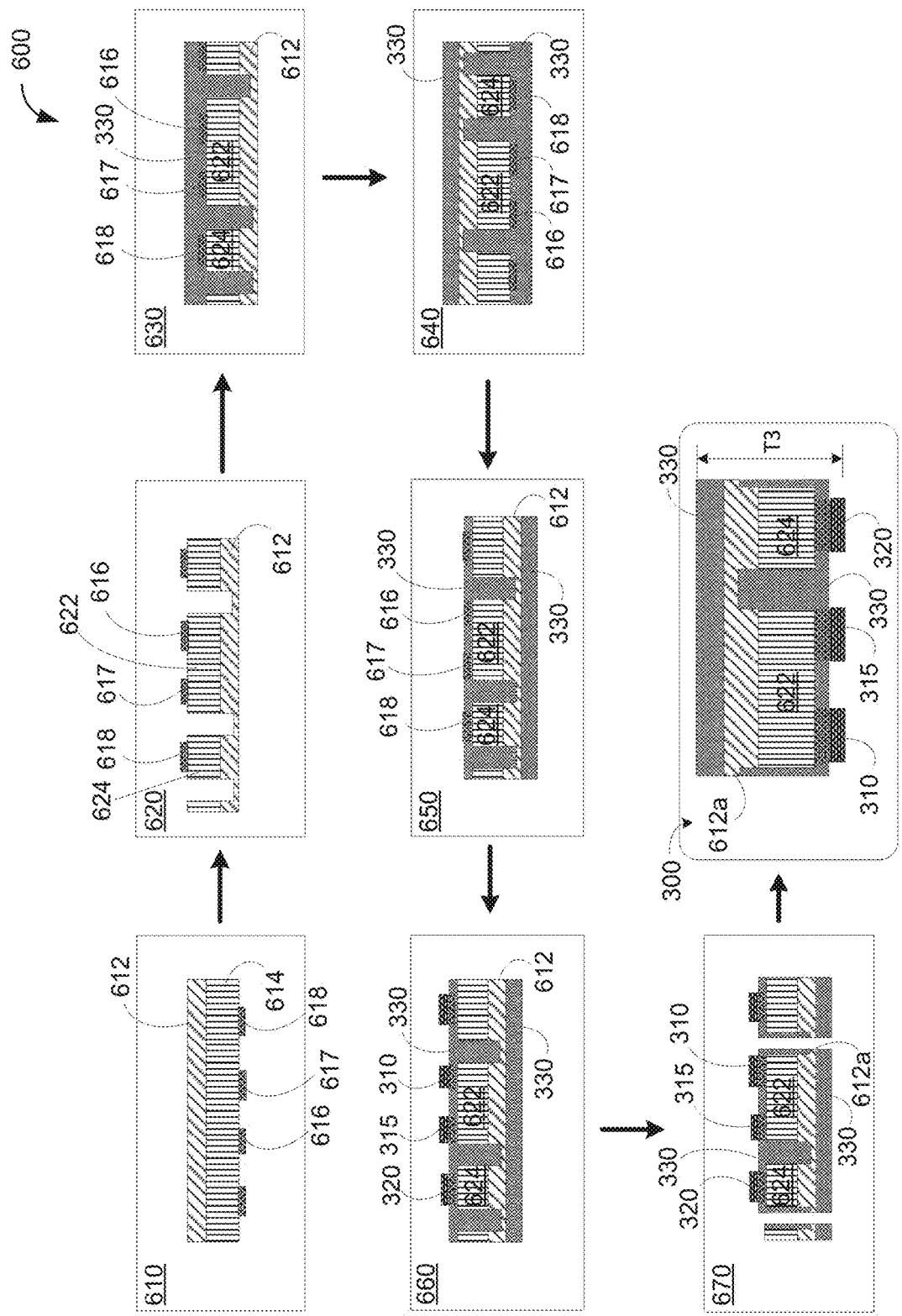
FIG. 6A is a diagram illustrating cross-sectional views of a manufacturing flow for producing the wafer-level package assembly of FIG. 2.

FIG. 3 is a diagram illustrating a plan view of yet another wafer-level semiconductor package assembly 300. The package assembly 300 can be produced, for example, using the assembly manufacturing flow shown in FIG. 6A, which is described below. Briefly, however, the package assembly 300 in FIG. 3 is shown with a section line C-C, which is a section line along which the cross-sectional views of FIG. 6A are taken.

As shown in FIG. 3, the package assembly 300 includes a first electrical contact 310, a second electrical contact 315 and a third electrical contact 320, which can each be disposed on a surface of the package assembly 300. In some implementations, the electrical contacts 310 and 315 can be to a first semiconductor die that is disposed within the package assembly 300, while the electrical contact 320 can be to a second semiconductor die that is also disposed within the package assembly 300. For example, the electrical contact 310 can be to a first signal terminal on a surface of the first semiconductor die, while the electrical contact 315 can be to a second signal terminal on the surface of the first semiconductor die. The electrical contacts 310 and 315 can each include a conductive pillar or post (e.g., a copper post) that is disposed on a respective signal pad of the first semiconductor die. The electrical contacts 310 and 315 can further include respective solder bumps that are formed on the conductive pillars. In some implementations, the electrical contact 320 can be to the second semiconductor die. For example, the electrical contact 320 can include a conductive pillar or post (e.g., a copper post) that is disposed on a surface of (e.g., a signal terminal) of the second semiconductor die. The electrical contact 320 can further include a solder bump that is formed on the conductive pillar disposed on the second semiconductor die.

In some implementations, the first semiconductor die can include a transistor device, such as a metal-oxide-semiconductor field-effect transistor (MOSFET), and the second semiconductor die can include a diode, where the transistor device is electrically coupled with the diode within the package assembly 300, such as using the techniques described herein. For instance, a drain terminal of a MOSFET device of the first semiconductor die can be coupled with a diode of the second semiconductor die within the package assembly 300. In the package assembly 300, where the first semiconductor die includes a MOSFET device, the electrical contact 310 can be to a source terminal of the MOSFET device, while the electrical contact 315 is to a gate terminal of the MOSFET device, or vice versa.

In the package assembly 300, the first semiconductor die and the second semiconductor die can be of different sizes. For instance the first semiconductor die can be larger than the second semiconductor die (e.g., the first semiconductor die can include a transistor device that is larger than a diode of the second semiconductor die). In other implementations, the first semiconductor die and/or the second semiconductor die of the package assembly 300 can include different electrical devices, such as resistors, transistor, capacitors, etc.

As also shown in FIG. 3, the package assembly 300 can include a molding compound 330. The molding compound 330, as with the molding compound 130 of the package assembly 100 and the molding compound 230 of the package assembly 200, can be an epoxy molding compound, a liquid molding compound, or other appropriate molding compound for the particular implementation. The first electrical contact 310, the second electrical contact 315 and the third electrical contact 320 can be exposed through the molding compound 330. For example, in certain implementations, respective conductive (e.g., copper, copper-nickel, etc.) posts for each of the electrical contacts 310, 315 and 320 of the package assembly 300 can be exposed through the molding compound 330. Further in the package assembly 300, a conductive material, such as a solder bump or other conductive material, can be disposed on the exposed surfaces of the conductive posts to form, respectively, the electrical contact 310, the electrical contact 315, and the electrical contact 320. Electrical contacts 310, 315 and 320 can be used to electrically couple the package assembly 300 with, e.g., a printed circuit board.

As also shown in FIG. 3, the package assembly 300 can have a length of L3 and a width of W3, where L3 and W3 can vary depending on the particular implementation. In example implementations, L3 can be between 0.40 mm and 10.00 mm, while W2 can be between 0.20 mm and 10.00 mm. In other implementations, L3 and W3 can have different values.

FIG. 4A is a diagram including cross-sectional views that illustrate a manufacturing flow 400 for producing the wafer-level package assembly 100 of FIG. 1. As noted above, the wafer-level manufacturing flow 400 of FIG. 4A is illustrated using cross-sectional views that are taken along a section line corresponding with the section line A-A shown in FIG. 1. Reference numbers from FIG. 1 are used in FIG. 4A to reference like elements of the package assembly 100 of FIG. 1. Also in FIG. 4A, while certain reference numbers may be repeated for each of the respective cross-sectional views illustrating the various operations of the manufacturing flow 400, the elements referenced in each view may not be specifically discussed.

In the manufacturing flow 400, at operation 410, a metal layer 412 can be attached (disposed on) and electrically coupled with a semiconductor wafer 414. In this example, the semiconductor wafer 414 can include the first semiconductor die (e.g., semiconductor die 422) and the second semiconductor die (e.g., semiconductor die 424) of the package assembly 100. As noted above with respect to FIG. 1, in some implementations, the first semiconductor die 422 and the second semiconductor die 424 can each be diodes of a same size (e.g., substantially same size, etc.). The metal layer 412, which can be directly disposed on the semiconductor wafer 414 (and, therefore, directly disposed on the first semiconductor die 422 and the second semiconductor die 424) can electrically couple a first side of the first semiconductor die 422 with a first side of the second semiconductor die 424, such as illustrated by the subsequent operations of the manufacturing flow 400.

In some implementations, the metal layer 412 can be a solid metal sheet (e.g., a copper sheet, a copper-nickel sheet, etc.) that is coupled directly with the semiconductor wafer 414 (e.g., using a conductive adhesive, using solder bumps that were previously formed on the semiconductor wafer 414, etc.). In other implementations, the metal layer 412 can be a patterned metal sheet that is coupled with (e.g., directly disposed on, etc.) the semiconductor wafer 414. For instance, the metal layer 412 can be patterned prior to attaching (affixing, coupling, etc.) the metal layer 412 with the semiconductor wafer 414. Alternatively, the metal layer 412 can be patterned after attaching the metal layer 412 to the semiconductor wafer 414. In some implementations, the metal layer 412 can be a deposited metal layer that is patterned or un-patterned.

At operation 420 (for which the illustrated cross-sectional view is inverted as compared to the cross-sectional view for operation 410), the manufacturing flow 400 includes cutting the semiconductor wafer 414 to separate the first semiconductor die 422 from the second semiconductor die 424; to separate the first semiconductor die 422 from the semiconductor wafer 414; and to separate the second semiconductor die 424 from the semiconductor wafer 414. The process of separating the first semiconductor die 422 and the second semiconductor die 424 can be referred to as singulation. Operation 420 of the manufacturing flow 400 can be performed using a laser cutting process, a plasma cutting process, a mechanical sawing process, etc. The particular approach used to singulate the first semiconductor die 422 and the second semiconductor die 424 can depend on the specific implementation.

As shown in FIG. 4A, the singulation process of operation 420 can also result in grooves 426 being formed in the metal layer 412, e.g., at least between the first semiconductor die 422 and the second semiconductor die 424. For instance, grooves 426 can be formed in the metal layer 412 around a perimeter of the first semiconductor die 422 and around a perimeter of the second semiconductor die 424.

As shown in FIG. 4A, at operation 430, the manufacturing flow 400 includes a first molding operation to overmold the first semiconductor die 422 and the second semiconductor die 424 with the molding compound 130, such that the molding compound 130 is disposed between the first semiconductor die 422 and the second semiconductor die 424, as well as on second sides (surfaces) of the first semiconductor die 422 and the second semiconductor die 424 that are opposite the first sides of the semiconductor dice 422 and 424 on which the metal layer 412 is disposed.

At operation 440 (for which the illustrated cross-sectional view is inverted as compared to the cross-sectional view for operation 430), the manufacturing flow 400 includes a second molding operation to overmold an exposed surface of the metal layer 412 (e.g., a surface of the metal layer 412 that is opposite the surface of the metal layer that is coupled with the semiconductor dice 422 and 424). The molding operations 430 and 440 of the manufacturing flow 400 at least partially encapsulate the first semiconductor die 422, the second semiconductor die 424 and the metal layer 412 in the molding compound 130.

At operation 450 (for which the illustrated cross-sectional view is inverted as compared to the cross-sectional view for operation 440), the manufacturing flow 400 includes performing a grinding operation to remove a portion of the molding compound 130 from the molding operation 430, and to expose the second surface of the first semiconductor die 422 and the second surface of the second semiconductor die 424. That is, the grinding operation 450 can be performed to expose the first semiconductor die 422 through the molding compound 130 (e.g., to facilitate formation of the first electrical contact 110 of the package assembly 100), and to expose the second semiconductor die 424 through the molding compound 130 (e.g., to facilitate formation of the second electrical contact 120 of the package assembly 100). In some implementations, the first electrical contact 110 can be the exposed second side of the first semiconductor die 422; and the second electrical contact 120 can be the exposed second side of the second semiconductor die 424.

In the manufacturing flow 400, at operation 460, patterned backside metal can be formed (e.g., by application of solder bumps, using photolithography, etc.) to define (form, etc.) the electrical contact 110 (on the second side of the first semiconductor die 422), and to define (form, etc.) the electrical contact 120 (on the second side of the second semiconductor die 424). At operation 470 of the manufacturing flow 400, another singulation process can be performed to cut the molding compound 130 and the metal layer 412 to singulate the package assembly 100 (as shown in FIG. 4A), where the (wafer-level) package assembly 100 includes the first semiconductor die 422, the second semiconductor die 424 and a portion 412*a* of the metal layer 412. The singulation operation 470 can be performed using a laser cutting process, a plasma cutting process, a mechanical sawing process, and/or any other appropriate singulation technique. As shown in FIG. 4A, the package assembly 100 can have a thickness of T1, which, as noted above, can be 200 μm or less.

Figure 4B:
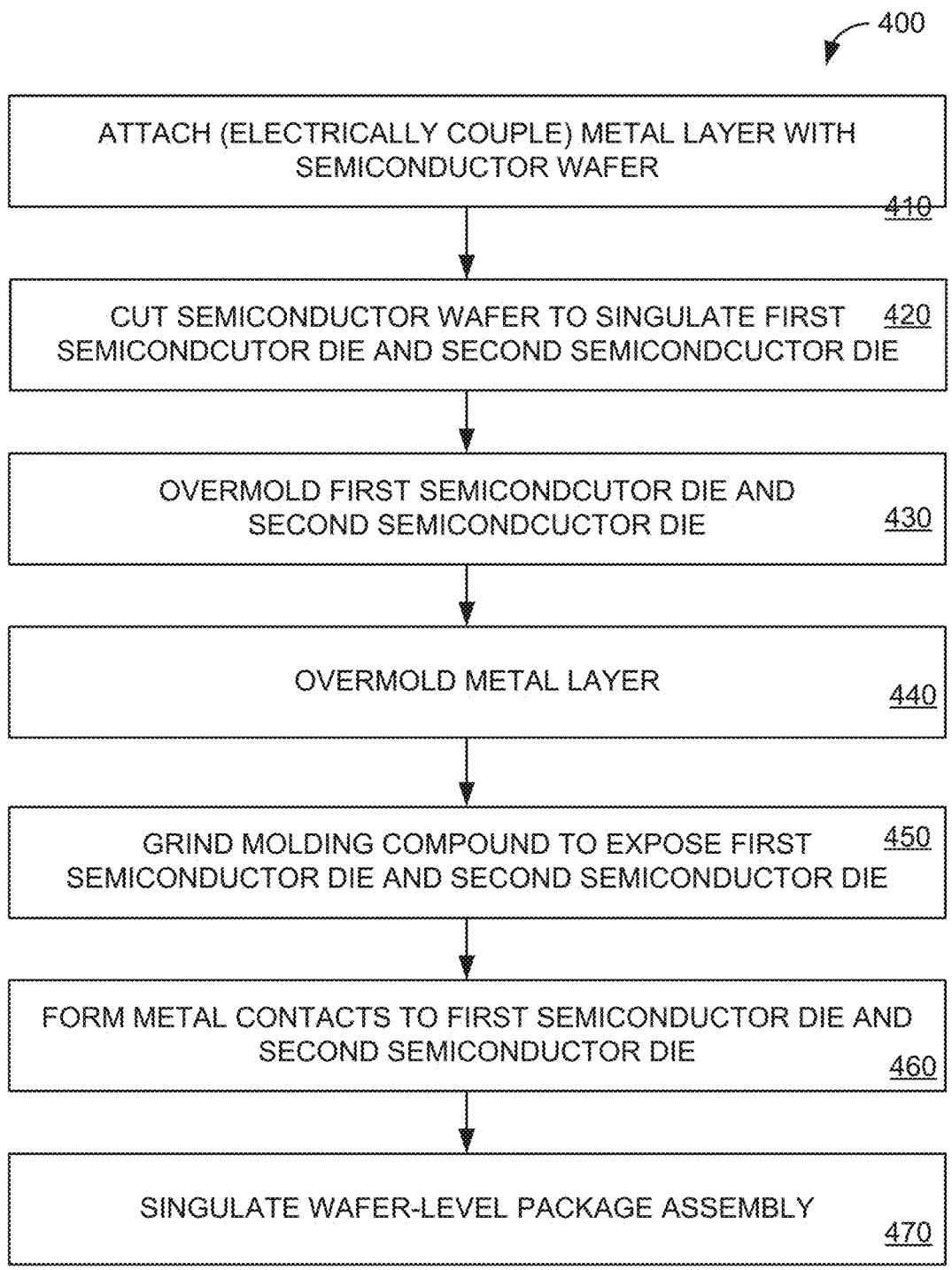
FIG. 4B is a flowchart illustrating the manufacturing flow of FIG. 4A.

FIG. 4B is a flowchart illustrating the manufacturing flow 400 of FIG. 4A. For purposes of illustration, the same reference numbers used for the operations in FIG. 4A will be used in FIG. 4B. FIG. 4B will also be described with further reference to FIG. 1.

At operation 410 of the manufacturing flow 400 in FIG. 4B, the metal layer 412 can be attached (disposed on) and electrically coupled with the semiconductor wafer 414. At operation 420, the manufacturing flow 400 includes cutting the semiconductor wafer 414 to separate the first semiconductor die 422 from the second semiconductor die 424; to separate the first semiconductor die 422 from the semiconductor wafer 414; and to separate the second semiconductor die 424 from the semiconductor wafer 414 (e.g., to singulate the first semiconductor die 422 and the second semiconductor die 424). At operation 430, the manufacturing flow 400 includes performing a first molding operation to overmold the first semiconductor die 422 and the second semiconductor die 424 with the molding compound 130, such as illustrated in FIG. 4A. At operation 440, the manufacturing flow 400 includes performing a second molding operation to overmold an exposed surface of the metal layer 412. At operation 450, the manufacturing flow 400 includes performing a grinding operation to remove a portion of the molding compound 130 from the molding operation 430, and to expose the second surface of the first semiconductor die 422 and the second surface of the second semiconductor die 424. At block 460, the manufacturing flow 400 includes forming a patterned backside metal to define (form, etc.) one or more electrical contacts, e.g., the electrical contact 110 and the electrical contact 120. At operation 470, the manufacturing flow 400 includes another singulation process can be performed to cut the molding compound 130 and the metal layer 412 to singulate the wafer-level package assembly 100.

FIG. 5A is a diagram including cross-sectional views that illustrate a manufacturing flow 500 for producing the wafer-level package assembly 200 of FIG. 2. As noted above, the wafer-level manufacturing flow 500 of FIG. 5A is illustrated using cross-sectional views that are taken along a section line corresponding with the section line B-B shown in FIG. 2. Reference numbers from FIG. 2 are used in FIG. 5A to reference like elements of the package assembly 200 of FIG. 2. Also in FIG. 5A, while certain reference numbers may be repeated for each of the respective cross-sectional views illustrating the various operations of the manufacturing flow 500, the elements referenced in each view may not be specifically discussed.

In the manufacturing flow 500, at operation 510, a metal layer 512 can be attached (disposed on) and electrically coupled with a semiconductor wafer 514. In this example, the semiconductor wafer 514 can include the first semiconductor die (e.g., semiconductor die 522) and the second semiconductor die (e.g., semiconductor die 524) of the package assembly 200. As noted above with respect to FIG. 2, in some implementations, a diode of the first semiconductor die 522 can be larger than a diode of the second semiconductor die 524 (e.g., the first semiconductor die 522, accordingly, being larger than the second semiconductor die 524). The metal layer 512, which can be directly disposed on the semiconductor wafer 514 (and, therefore, directly disposed on the first semiconductor die 522 and the second semiconductor die 524) can electrically couple a first side of the first semiconductor die 522 with a first side of the second semiconductor die 524, such as illustrated by the subsequent operations of the manufacturing flow 500.

In some implementations, the metal layer 512 can be a solid metal sheet (e.g., a copper sheet, a copper-nickel sheet, etc.) that is coupled directly with the semiconductor wafer 514 (e.g., using a conductive adhesive, using solder bumps that were previously formed on the semiconductor wafer 514, etc.). In other implementations, the metal layer 512 can be a patterned metal sheet that is coupled with (e.g., directly disposed on, etc.) the semiconductor wafer 514. For instance, the metal layer 512 can be patterned prior to attaching (affixing, coupling, etc.) the metal layer 512 with the semiconductor wafer 514. Alternatively, the metal layer 512 can be patterned after attaching the metal layer 512 to the semiconductor wafer 514. In some implementations, the metal layer 512 can be a deposited metal layer that is patterned or un-patterned.

At operation 520 (for which the illustrated cross-sectional view is inverted as compared to the cross-sectional view for operation 510), the manufacturing flow 500 includes cutting the semiconductor wafer 514 to separate the first semiconductor die 522 from the second semiconductor die 524; to separate the first semiconductor die 522 from the semiconductor wafer 514; and to separate the second semiconductor die 524 from the semiconductor wafer 514. As with operation 420 of the manufacturing flow 400, the process of separating the first semiconductor die 522 and the second semiconductor die 524 at operation 520 can be referred to as singulation. Operation 520 of the manufacturing flow 500, as with operation 420 of the manufacturing flow 400, can be performed using a laser cutting process, a plasma cutting process, a mechanical sawing process, etc. The particular approach used to singulate the first semiconductor die 522 and the second semiconductor die 524 can depend on the specific implementation.

As shown in FIG. 5A, the singulation process of operation 520 can also result in grooves 526 being formed in the metal layer 512, e.g., at least between the first semiconductor die 522 and the second semiconductor die 524. For instance, grooves 526 can be formed in the metal layer 512 around a perimeter of the first semiconductor die 522 and around a perimeter of the second semiconductor die 524.

As shown in FIG. 5A, at operation 530, the manufacturing flow 500 includes a first molding operation to overmold the first semiconductor die 522 and the second semiconductor die 524 with the molding compound 230, such that the molding compound 230 is disposed between the first semiconductor die 522 and the second semiconductor die 524, as well as on second sides (surfaces) of the first semiconductor die 522 and the second semiconductor die 524 that are opposite the first sides of the semiconductor dice 522 and 524 on which the metal layer 512 is disposed.

At operation 540 (for which the illustrated cross-sectional view is inverted as compared to the cross-sectional view for operation 530), the manufacturing flow 500 includes a second molding operation to overmold an exposed surface of the metal layer 512 (e.g., a surface of the metal layer 512 that is opposite the surface of the metal layer that is coupled with the semiconductor dice 522 and 524). The molding operations 530 and 540 of the manufacturing flow 500 at least partially encapsulate the first semiconductor die 522, the second semiconductor die 524 and the metal layer 512 in the molding compound 230.

At operation 550 (for which the illustrated cross-sectional view is inverted as compared to the cross-sectional view for operation 540), the manufacturing flow 500 includes performing a grinding operation to remove a portion of the molding compound 230 from the molding operation 530, and to expose the second surface of the first semiconductor die 522 and the second surface of the second semiconductor die 524. That is, the grinding operation 550 can be performed to expose the first semiconductor die 522 through the molding compound 230 (e.g., to facilitate formation of the first electrical contact 210 of the package assembly 200), and to expose the second semiconductor die 524 through the molding compound 230 (e.g., to facilitate formation of the second electrical contact 220 of the package assembly 200). In some implementations, the first electrical contact 210 can be the exposed second side of the first semiconductor die 522; and the second electrical contact 220 can be the exposed second side of the second semiconductor die 524.

In the manufacturing flow 500, at operation 560, patterned backside metal can be formed (e.g., by application of solder bumps, using photolithography, etc.) to define (form, etc.) the electrical contact 210 (on the second side of the first semiconductor die 522), and to define (form, etc.) the electrical contact 220 (on the second side of the second semiconductor die 524). At operation 570 of the manufacturing flow 500, another singulation process can be performed to cut the molding compound 230 and the metal layer 512 to singulate the package assembly 200, where the (wafer-level) package assembly 200 includes the first semiconductor die 522, the second semiconductor die 524 and a portion 512a of the metal layer 512. The singulation operation 570 can be performed using a laser cutting process, a plasma cutting process, a mechanical sawing process, and/or any other appropriate singulation technique. As shown in FIG. 5A, the package assembly 200 can have a thickness of T2, which, as noted above, can be 200 µm or less.

Figure 5B:
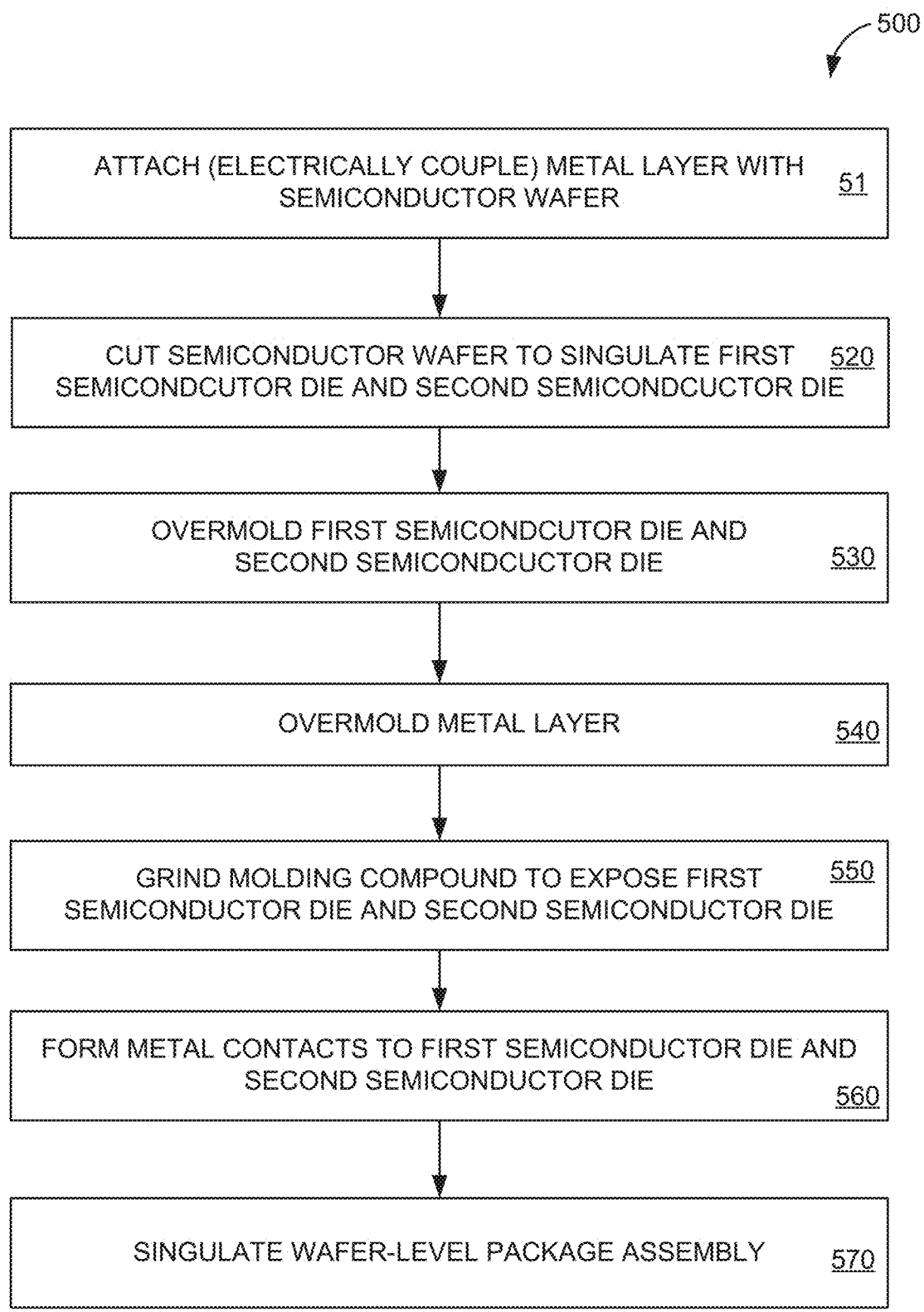
FIG. 5B is a flowchart illustrating the manufacturing flow of FIG. 5A.

FIG. 5B is a flowchart illustrating the manufacturing flow 500 of FIG. 5A. For purposes of illustration, the same reference numbers used for the operations in FIG. 5A will be used in FIG. 5B. FIG. 5B will also be described with further reference to FIG. 2.

At operation 510 of the manufacturing flow 500 in FIG. 5B, the metal layer 512 can be attached (disposed on) and electrically coupled with the semiconductor wafer 514. At operation 520, the manufacturing flow 500 includes cutting the semiconductor wafer 514 to separate the first semiconductor die 522 from the second semiconductor die 524; to separate the first semiconductor die 522 from the semiconductor wafer 514; and to separate the second semiconductor die 524 from the semiconductor wafer 514 (e.g., to singulate the first semiconductor die 522 and the second semiconductor die 524). At operation 530, the manufacturing flow 500 includes performing a first molding operation to overmold the first semiconductor die 522 and the second semiconductor die 524 with the molding compound 230, such as illustrated in FIG. 5A. At operation 540, the manufacturing flow 500 includes performing a second molding operation to overmold an exposed surface of the metal layer 512. At operation 550, the manufacturing flow 500 includes performing a grinding operation to remove a portion of the molding compound 230 from the molding operation 530, and to expose the second surface of the first semiconductor die 522 and the second surface of the second semiconductor die 524. At block 560, the manufacturing flow 500 includes forming a patterned backside metal to define (form, etc.) one or more electrical contacts, e.g., the electrical contact 210 and the electrical contact 220. At operation 570, the manufacturing flow 500 includes performing another singulation process to cut the molding compound 230 and the metal layer 512 to singulate the wafer-level package assembly 200.

FIG. 6A is a diagram including cross-sectional views that illustrate a manufacturing flow 600 for producing the wafer-level package assembly 300 of FIG. 3. As noted above, the wafer-level manufacturing flow 600 of FIG. 6A is illustrated using cross-sectional views that are taken along a section line corresponding with the section line C-C shown in FIG. 3. Reference numbers from FIG. 3 are used in FIG. 6A to reference like elements of the package assembly 300 of FIG. 3. Also in FIG. 6A, while certain reference numbers may be repeated for each of the respective cross-sectional views illustrating the various operations of the manufacturing flow 600, the elements referenced in each view may not be specifically discussed.

In the manufacturing flow 600, at operation 610, a metal layer 612 can be attached (disposed on) and electrically coupled with a first side of a semiconductor wafer 614. In this example, the semiconductor wafer 614 can include the first semiconductor die (e.g., semiconductor die 622) and the second semiconductor die (e.g., semiconductor die 624) of the package assembly 300. As noted above with respect to FIG. 3, in this example, the first semiconductor die 622 can include a transistor (e.g., MOSFET) device, while the second semiconductor die 624 can include a diode. As also noted above with respect to FIG. 3, in some implementations, the first semiconductor die 622 can be larger than the second semiconductor die 624, such as shown in FIG. 6A. The metal layer 612, which can be directly disposed on the semiconductor wafer 614 (and, therefore, directly disposed on the first semiconductor die 622 and the second semiconductor die 624) can electrically couple a first side of the first semiconductor die 622 (e.g., a drain terminal of the MOSFET) with a first side (e.g., a first terminal of the diode) of the second semiconductor die 624, such as illustrated by the subsequent operations of the manufacturing flow 600.

In some implementations, the metal layer 612 can be a solid metal sheet (e.g., a copper sheet, a copper-nickel sheet, etc.) that is coupled directly with the semiconductor wafer 614 (e.g., using a conductive adhesive, using solder bumps that were previously formed on the semiconductor wafer 614, etc.). In other implementations, the metal layer 612 can be a patterned metal sheet that is coupled with (e.g., directly disposed on, etc.) the semiconductor wafer 614. For instance, the metal layer 612 can be patterned prior to attaching (affixing, coupling, etc.) the metal layer 612 with the semiconductor wafer 614. Alternatively, the metal layer 612 can be patterned after attaching the metal layer 612 to the semiconductor wafer 614. In some implementations, the metal layer 612 can be a deposited metal layer that is patterned or un-patterned.

As also shown for operation 610 of the manufacturing flow 600, conductive pillars (e.g., copper pillars, copper-nickel pillars, etc.) 616, 617 and 618 can be disposed on a second side of the semiconductor wafer 614 that is opposite the side of the semiconductor wafer 614 on which the metal layer 612 is disposed. In this example, the conductive pillar 616 can be (directly) disposed on (affixed with, coupled with, electrically coupled with, etc.) a source terminal of the MOSFET of the first semiconductor die 622. The conductive pillar 617 can be (directly) disposed on (affixed with, coupled with, electrically coupled with, etc.) a gate terminal of the MOSFET of the first semiconductor die 622. Further in this example, the conductive pillar 618 can be (directly) disposed on (affixed with, coupled with, electrically coupled with, etc.) a second terminal of the diode of the second semiconductor die 624 (e.g., a side of the second semiconductor die 624 that is opposite to the side to which the metal layer 612 is affixed).

At operation 620 (for which the illustrated cross-sectional view is inverted as compared to the cross-sectional view for operation 610), the manufacturing flow 600 includes cutting the semiconductor wafer 614 to separate the first semiconductor die 622 from the second semiconductor die 624; to separate the first semiconductor die 622 from the semiconductor wafer 614; and to separate the second semiconductor die 624 from the semiconductor wafer 614. As with operation 420 of the manufacturing flow 400 and the operation 520 of the manufacturing flow 500, the process of separating the first semiconductor die 622 and the second semiconductor die 624 at operation 620 can be referred to as singulation. Operation 620 of the manufacturing flow 600, as with operations 420 and 520 of their respective manufacturing flows 400 and 500, can be performed using a laser cutting process, a plasma cutting process, a mechanical sawing process, etc. The particular approach used to singulate the first semiconductor die 622 and the second semiconductor die 624 can depend on the specific implementation.

As shown in FIG. 6A, the singulation process of operation 620 can also result in grooves 626 being formed in the metal layer 612, e.g., at least between the first semiconductor die 622 and the second semiconductor die 624. For instance, grooves 626 can be formed in the metal layer 612 around a perimeter of the first semiconductor die 622 and around a perimeter of the second semiconductor die 624.

As shown in FIG. 6A, at operation 630, the manufacturing flow 600 includes a first molding operation to overmold the first semiconductor die 622, the second semiconductor die 624 and the conductive pillars 616, 617 and 618 with the molding compound 330, such that the molding compound 630 is disposed between the first semiconductor die 622 and the second semiconductor die 624, as well as encapsulating the first semiconductor die 622, the second semiconductor die 624 and the conductive pillars 616, 617 and 618.

At operation 640 (for which the illustrated cross-sectional view is inverted as compared to the cross-sectional view for operation 630), the manufacturing flow 600 includes a second molding operation to overmold an exposed surface of the metal layer 612 (e.g., a surface of the metal layer 612 that is opposite the surface of the metal layer that is coupled with the semiconductor dice 622 and 624).

At operation 650 (for which the illustrated cross-sectional view is inverted as compared to the cross-sectional view for operation 640), the manufacturing flow 600 includes performing a grinding operation to remove a portion of the molding compound 630 from the molding operation 630, and to expose the conductive pillars 616, 617 and 618 through the molding compound 330. That is, the grinding operation 650 can be performed to expose the conductive pillars 616, 617 and 618 to facilitate formation of the first electrical contact 310, the second electrical contact 315 and the third electrical contact 320 of the package assembly 300 of FIG. 3.

In the manufacturing flow 600, at operation 660, patterned backside metal can be formed (e.g., by application of solder bumps, using photolithography, etc.) to define (form, etc.) the electrical contacts 310, 315 and 320 on the exposed surfaces of, respectively, the conductive pillars, 616, 617 and 618.

At operation 670 of the manufacturing flow 600, another singulation process can be performed to cut the molding compound 330 and the metal layer 612 to singulate the package assembly 300, where the (wafer-level) package assembly 300 includes the first semiconductor die 622, the second semiconductor die 624 and a portion 612a of the metal layer 612. The singulation operation 670 can be performed using a laser cutting process, a plasma cutting process, a mechanical sawing process, and/or any other appropriate singulation technique. As shown in FIG. 6A, the package assembly 300 can have a thickness of T3, which, as noted above, can be 200 µm or less.

Figure 6B:
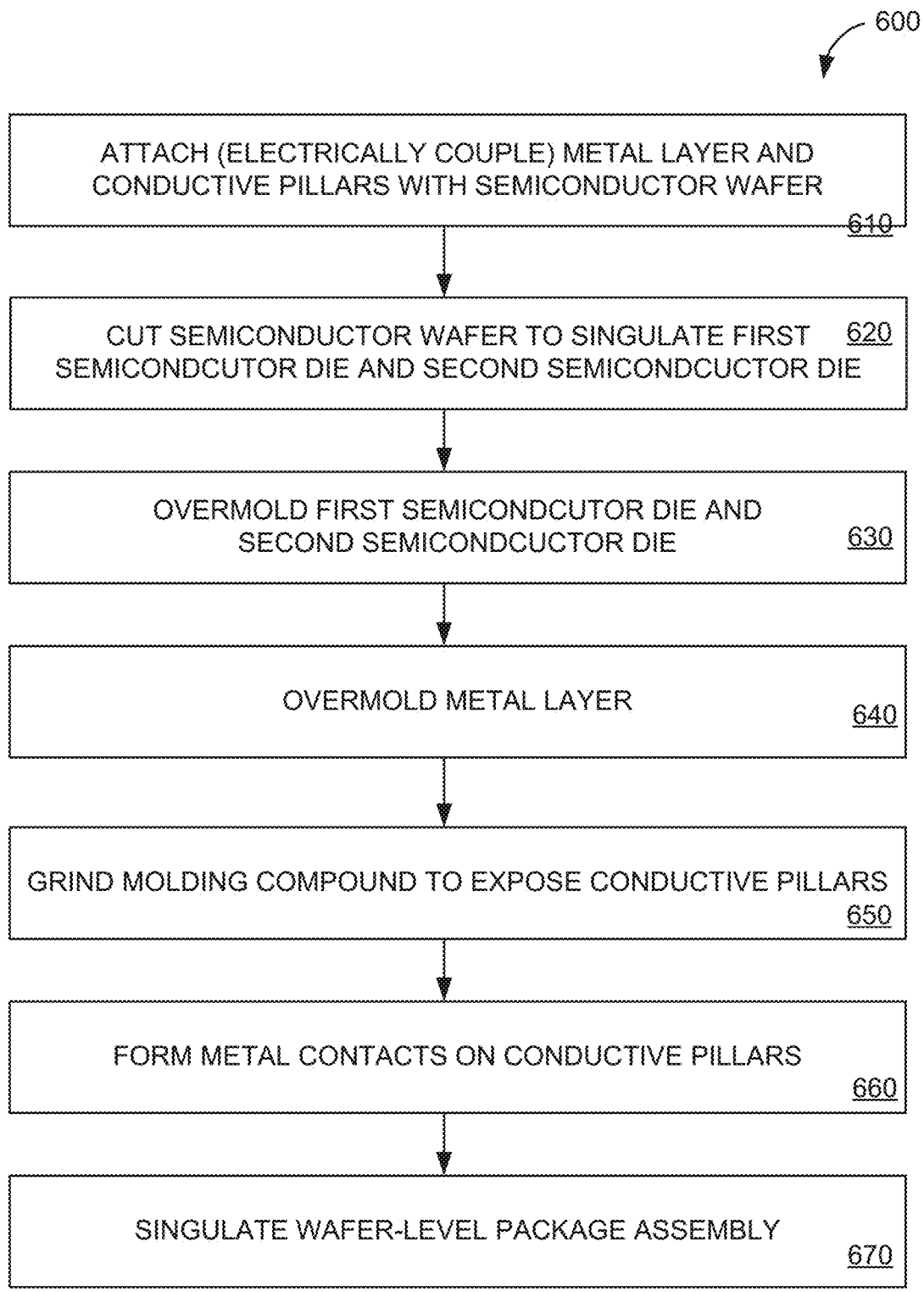
FIG. 6B is a flowchart illustrating the manufacturing flow of FIG. 6A.

FIG. 6B is a flowchart illustrating the manufacturing flow 600 of FIG. 6A. For purposes of illustration, the same reference numbers used for the operations in FIG. 6A will be used in FIG. 6B. FIG. 6B will also be described with further reference to FIG. 3.

At operation 610 of the manufacturing flow 600 in FIG. 6B, the metal layer 612 can be attached (disposed on) and electrically coupled with the semiconductor wafer 614, and the conductive pillars 616, 617 and 618 can be disposed on the second side of the semiconductor wafer 614. At operation 620, the manufacturing flow 600 includes cutting the semiconductor wafer 614 to separate the first semiconductor die 622 from the second semiconductor die 624; to separate the first semiconductor die 622 from the semiconductor wafer 614; and to separate the second semiconductor die 624 from the semiconductor wafer 614 (e.g., to singulate the first semiconductor die 622 and the second semiconductor die 624). At operation 630, the manufacturing flow 600 includes performing a first molding operation to overmold the first semiconductor die 622 and the second semiconductor die 624 with the molding compound 330, such as illustrated in FIG. 6A. At operation 640, the manufacturing flow 600 includes performing a second molding operation to overmold an exposed surface of the metal layer 612. At operation 650, the manufacturing flow 600 includes performing a grinding operation to remove a portion of the molding compound 330 from the molding operation 630, and to expose the conductive pillars 616, 617 and 618. At block 660, the manufacturing flow 600 includes forming a patterned backside metal to define (form, etc.) one or more electrical contacts, e.g., the electrical contact 310, the electrical contact 315 and the electrical contact 220. At operation 670, the manufacturing flow 600 includes performing another singulation process to cut the molding compound 330 and the metal layer 612 to singulate the wafer-level package assembly 300.

In a general aspect, an apparatus can include: a metal layer; a first semiconductor die having a first side and a second side that is opposite the first side, the first side of the first semiconductor die being disposed on the metal layer; and a second semiconductor die having a first side and a second side that is opposite the first side, the first side of the second semiconductor die being disposed on the metal layer. The metal layer can electrically couple the first side of the first semiconductor die with the first side of the second semiconductor die. The apparatus can also include a molding compound at least partially encapsulating the metal layer, the first semiconductor die and the second semiconductor die. The apparatus can further include a first electrical contact and a second electrical contact. The first electrical contact can be to the second side of the first semiconductor die, and the first electrical contact can be disposed on a surface of the apparatus. The second electrical contact can be to the second side of the second semiconductor die, and the second electrical contact can be disposed on the surface of the apparatus.

Implementations can include one or more of the following features. For instance, the first electrical contact and the second electrical contact can be exposed through the molding compound. The first electrical contact can include at least a portion of the second side of the first semiconductor die. The second electrical contact can include at least a portion of the second side of the second semiconductor die. The first electrical contact can include a first solder bump disposed on the second side of the first semiconductor die and the second electrical contact can include a second solder bump disposed on the second side of the second semiconductor die.

The metal layer can include a portion of a solid metal sheet. The metal layer can include a portion of a patterned metal sheet. The metal layer can include a groove disposed between the first semiconductor die and the second semiconductor die.

The molding compound can be disposed between the first semiconductor die and the second semiconductor die.

The first semiconductor die can include a first diode, and the second semiconductor die can include a second diode.

The first semiconductor die can include a metal-oxide-semiconductor field-effect transistor (MOSFET); and the second semiconductor die can include a diode. The apparatus can include a third electrical contact. The third electrical contact can be to the second side of the first semiconductor die, and the third electrical contact can be disposed on the surface of the apparatus. The first electrical contact can be electrically coupled with a source terminal of the MOSFET. The third electrical contact can be electrically coupled with a gate terminal of the MOSFET. The metal layer can be electrically coupled with a drain terminal of the MOSFET.

In another general aspect, an apparatus can include: a metal layer; a first semiconductor die having a first side and a second side that is opposite the first side, the first side of the first semiconductor die being disposed on the metal layer; and a second semiconductor die having a first side and a second side that is opposite the first side, the first side of the second semiconductor die being disposed on the metal layer. The metal layer can electrically couple the first side of the semiconductor die with the first side of the second semiconductor die. The apparatus can also include a molding compound at least partially encapsulating the metal layer, the first semiconductor die and the second semiconductor die. The apparatus can also include a first conductive pillar and a second conductive pillar. The first conductive pillar can be disposed on, and electrically coupled with the second side of the first semiconductor. The first conductive pillar can be exposed through the molding compound on a surface of the apparatus. The second conductive pillar can be disposed on, and electrically coupled with the second side of the second semiconductor die. The second conductive pillar can be exposed through the molding compound on the surface of the apparatus.

Implementations can include one or more of the following features. For instance, the first semiconductor die can include a metal-oxide-semiconductor field-effect transistor (MOSFET) and the second semiconductor die can include a diode. The apparatus can include a third conductive pillar disposed on, and electrically coupled with the second side of the first semiconductor die. The third conductive pillar can be exposed through the molding compound on the surface of the apparatus. The first conductive pillar can be electrically coupled with a source terminal of the MOSFET. The third conductive pillar can be electrically coupled with a gate terminal of the MOSFET. The metal layer can be electrically coupled with a drain terminal of the MOSFET.

The metal layer can include a portion of a solid metal sheet. The metal layer can include a portion of a patterned metal sheet. The metal layer can include a groove disposed between the first semiconductor die and the second semiconductor die.

The molding compound is disposed between the first semiconductor die and the second semiconductor die.

In another general aspect, a method can include attaching and electrically coupling a metal layer with a semiconductor wafer. The semiconductor wafer can include a first semiconductor die and a second semiconductor die. The metal layer can electrically couple a first side of the first semiconductor die with a first side of the second semiconductor die. The method can also include cutting the semiconductor wafer to: separate the first semiconductor die from the second semiconductor die; separate the first semiconductor die from the semiconductor wafer; and separate the second semiconductor die from the semiconductor wafer. The method can further include performing a molding operation to at least partially encapsulate the metal layer, the first semiconductor die and the second semiconductor die in a molding compound. The method can also further include grinding the molding compound to: expose a first electrical contact, the first electrical contact being to a second side of the first semiconductor die; and expose a second electrical contact, the second electrical contact being to a second side of the second semiconductor die. The method can still further include cutting the molding compound and the metal layer to singulate a wafer-level packaged assembly. The wafer-level packaged assembly can include the first semiconductor die and the second semiconductor die.

Implementations can include one or more of the following features. For instance, the method can include: attaching and electrically coupling a first conductive pillar with the second side of the first semiconductor die, the first electrical contact including the first conductive pillar; and attaching and electrically coupling a second conductive pillar with the second side of the second semiconductor die, the second electrical contact including the second conductive pillar.

In the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown (e.g., in the drawings) as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Galium Arsenide (GaAs), Galium Nitride (GaN), and/or so forth.

While certain features of the described implementations have been illustrated as described herein, many modifications, substitutions, changes and equivalents will now occur to those skilled in the art. The appended claims are intended to cover all such modifications and changes as fall within the scope of the implementations. The example implementations described herein and shown in the drawings have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
   a metal layer;
   a first semiconductor die having a first side and a second side that is opposite the first side, the first side of the first semiconductor die being disposed on the metal layer;
   a second semiconductor die having a first side and a second side that is opposite the first side, the first side of the second semiconductor die being disposed on the metal layer, the metal layer electrically coupling the first side of the first semiconductor die with the first side of the second semiconductor die;
   a molding compound at least partially encapsulating the metal layer, the first semiconductor die and the second semiconductor die;
   a first electrical contact, the first electrical contact being to the second side of the first semiconductor die, the first electrical contact being disposed on a surface of the apparatus; and
   a second electrical contact, the second electrical contact being to the second side of the second semiconductor die, the second electrical contact being disposed on the surface of the apparatus,
   the metal layer including a groove disposed between the first semiconductor die and the second semiconductor die.

2. The apparatus of claim 1, wherein the first electrical contact and the second electrical contact are exposed through the molding compound.

3. The apparatus of claim 1, wherein the first electrical contact includes at least a portion of the second side of the first semiconductor die and the second electrical contact includes at least a portion of the second side of the second semiconductor die.

4. The apparatus of claim 1, wherein the first electrical contact includes a first solder bump disposed on the second side of the first semiconductor die and the second electrical contact includes a second solder bump disposed on the second side of the second semiconductor die.

5. The apparatus of claim 1, wherein the metal layer includes a portion of a solid metal sheet.

6. The apparatus of claim 1, wherein the metal layer includes a portion of a patterned metal sheet.

7. The apparatus of claim 1, wherein the molding compound is disposed between the first semiconductor die and the second semiconductor die.

8. The apparatus of claim 1, wherein:
   the first semiconductor die includes a first diode; and
   the second semiconductor die includes a second diode.

9. The apparatus of claim 1, wherein:
   the first semiconductor die includes a metal-oxide-semiconductor field-effect transistor (MOSFET); and
   the second semiconductor die includes a diode.

10. The apparatus of claim 9, further comprising a third electrical contact,
    the third electrical contact being to the second side of the first semiconductor die, the third electrical contact being disposed on the surface of the apparatus,
    the first electrical contact being electrically coupled with a source terminal of the MOSFET, the third electrical contact being electrically coupled with a gate terminal of the MOSFET, and the metal layer being electrically coupled with a drain terminal of the MOSFET.

11. An apparatus comprising:
a metal layer;
a first semiconductor die having a first side and a second side that is opposite the first side, the first side of the first semiconductor die being disposed on the metal layer;
a second semiconductor die having a first side and a second side that is opposite the first side, the first side of the second semiconductor die being disposed on the metal layer, the metal layer electrically coupling the first side of the first semiconductor die with the first side of the second semiconductor die;
a molding compound at least partially encapsulating the metal layer, the first semiconductor die and the second semiconductor die;
a first conductive pillar disposed on, and electrically coupled with a first signal pad disposed on the second side of the first semiconductor, the first conductive pillar being exposed through the molding compound on a surface of the apparatus; and
a second conductive pillar disposed on, and electrically coupled with a second signal pad disposed on the second side of the second semiconductor die, the second conductive pillar being exposed through the molding compound on the surface of the apparatus.

12. The apparatus of claim 11, wherein:
the first semiconductor die includes a metal-oxide-semiconductor field-effect transistor (MOSFET); and
the second semiconductor die includes a diode.

13. The apparatus of claim 12, further comprising a third conductive pillar disposed on and electrically coupled with the second side of the first semiconductor die, the third conductive pillar being exposed through the molding compound on the surface of the apparatus,
the first conductive pillar being electrically coupled with a source terminal of the MOSFET, the third conductive pillar being electrically coupled with a gate terminal of the MOSFET, and the metal layer being electrically coupled with a drain terminal of the MOSFET.

14. The apparatus of claim 11, wherein the metal layer includes a portion of a solid metal sheet.

15. The apparatus of claim 11, wherein the metal layer includes a portion of a patterned metal sheet.

16. The apparatus of claim 11, wherein the metal layer includes a groove disposed between the first semiconductor die and the second semiconductor die.

17. The apparatus of claim 11, wherein the molding compound is disposed between the first semiconductor die and the second semiconductor die.

\* \* \* \* \*